(12) United States Patent
Garandet et al.

(10) Patent No.: US 9,230,806 B2
(45) Date of Patent: Jan. 5, 2016

(54) METHOD FOR PREPARING A COARSE-GRAIN CRYSTALLIZED SILICON LAYER

(71) Applicants: COMMISSARIAT A L'ENERGIE ATOMIQUE ET AUX ENERGIES ALTERNATIVES, Paris (FR); S'TILE, Buxerolles (FR)

(72) Inventors: Jean-Paul Garandet, Le Bourget du Lac (FR); Virginie Brize, Saint Martin D'heres (FR); Etienne Pihan, La Motte Servolex (FR); Alain Straboni, Buxerolles (FR); Florent Dupont, Montamise (FR)

(73) Assignees: Commissariat a l'Energie Atomique et aux Energies Alternatives, Paris (FR); S'Tile, Buxerolles (FR)

( * ) Notice: Subject to any disclaimer, the term of this patent is extended or adjusted under 35 U.S.C. 154(b) by 0 days.

(21) Appl. No.: 14/391,865

(22) PCT Filed: Apr. 8, 2013

(86) PCT No.: PCT/IB2013/052800
§ 371 (c)(1),
(2) Date: Oct. 10, 2014

(87) PCT Pub. No.: WO2013/153504
PCT Pub. Date: Oct. 17, 2013

(65) Prior Publication Data
US 2015/0079772 A1    Mar. 19, 2015

(30) Foreign Application Priority Data
Apr. 11, 2012 (FR) .................................... 12 53319

(51) Int. Cl.
| | | |
|---|---|---|
| *H01L 21/20* | (2006.01) | |
| *H01L 21/36* | (2006.01) | |
| *H01L 21/02* | (2006.01) | |
| *C30B 1/02* | (2006.01) | |
| *C30B 29/06* | (2006.01) | |
| *H01L 31/18* | (2006.01) | |
| *H01L 31/0368* | (2006.01) | |

(52) U.S. Cl.
CPC ............ *H01L 21/02667* (2013.01); *C30B 1/02* (2013.01); *C30B 29/06* (2013.01); *H01L 21/02532* (2013.01); *H01L 21/02595* (2013.01); *H01L 21/02612* (2013.01); *H01L 21/02628* (2013.01); *H01L 31/03682* (2013.01); *H01L 31/182* (2013.01); *H01L 31/1872* (2013.01); *Y02E 10/546* (2013.01)

(58) Field of Classification Search
USPC ........................................................ 438/478
See application file for complete search history.

(56) References Cited

U.S. PATENT DOCUMENTS

| 2006/0030131 A1 | 2/2006 | Richardson et al. .......... 438/482 |
| 2007/0178675 A1 | 8/2007 | Straboni ...................... 438/493 |
| 2010/0075487 A1 | 3/2010 | Bouchut ...................... 438/487 |
| 2014/0206126 A1* | 7/2014 | Chaudhari ..................... 438/57 |

FOREIGN PATENT DOCUMENTS

| EP | 2 071 058 | 6/2009 |
| WO | 2004/093202 | 10/2014 |

OTHER PUBLICATIONS

K. Peter et al., "Thin film silicon solar cells on upgraded metallurgical silicon substrates prepared by LPE"; Solar Energy Materials and Solar Cells 74 (2002) 219.
J.M. Olchowik et al., "Influence of LPE process technological conditions on Si ELO layers morphology", J. Non-Crystalline Solids 354 (2008) 4287.
S. Reber, A. Hurrle, A. Eyer, G. Wilke, "Crystalline silicon thin film solar cells—recent results at Fraunhoffer ISE", Solar Energy, 77 (2004) 865-875.
J.M. Lebrun, C. Pascal, J.P. Missiaen, J. Am. Ceramic. Soc., 1-9 (2012), DOI: 10.1111/j.1551-2916.2011.05052.x.

* cited by examiner

*Primary Examiner* — Asok K Sarkar
(74) *Attorney, Agent, or Firm* — Norton Rose Fulbright US LLP

(57) ABSTRACT

The present invention relates to a method for forming a crystallized silicon layer made up of grains having an average size of no less than 20 μm, including at least the steps that comprise: (1) providing a layer of silicon to be (re)crystallized, the average grain size of which is less than 10 μm; (2) placing said layer of silicon to be (re)crystallized in contact with a liquid composition at least partially made up of a metal solvent; and (3) exposing the assembly to a thermal treatment suitable for (re)crystallizing said layer of silicon with the expected grain size, characterized in that said thermal treatment includes heating the assembly made up of the layer of silicon in contact with said liquid composition to a temperature that is lower than 1410° C. and at least equal to the eutectic temperature in the solvent-silicon phase diagram.

18 Claims, No Drawings

METHOD FOR PREPARING A COARSE-GRAIN CRYSTALLIZED SILICON LAYER

CROSS-REFERENCE TO RELATED APPLICATIONS

This application is a national phase application under 35 U.S.C. §371 of International Application No. PCT/IB2013/052800 filed 8 Apr. 2013, which claims priority to French Patent Application No. 1253319 filed 11 Apr. 2012. The entire contents of each of the above-referenced disclosures is specifically incorporated herein by reference without disclaimer.

The present invention relates to a process of use for converting a layer of silicon of reduced grain size into a layer of coarse-grained crystalline silicon via a liquid-phase maturation process of the silicon grains.

Silicon crystallized in the form of grains having a size of greater than 20 µm is indeed particularly advantageous for its semiconductor properties within the context of the production of photovoltaic cells.

Currently, photovoltaic cells are predominately manufactured from monocrystalline or polycrystalline silicon. The commonest chain of production for crystalline silicon employs the solidification of ingots from a bath of liquid silicon. These ingots are then cut into wafers, which may be converted into photovoltaic cells. Unfortunately, the sawing of the ingots leads to a loss of silicon material of the order of 50%. For obvious reasons, this loss of material linked to the sawing is prejudicial to the production yields.

In order to avoid the loss of material that occurs when these ingots are sawed into wafers, techniques have been developed with a view to directly producing silicon wafers from ingots.

However, the methods proposed for producing silicon in the form of wafers or ribbons having a typical thickness that varies between 100 and 500 µm (Edge-defined Film-fed Growth, Ribbon Against Drop and Ribbon Growth on Substrate) are not completely satisfactory, especially with regard to the problems of cost and/or process control that they give rise to.

The liquid phase epitaxy (LPE) technique [1-2] or gaseous technique (CVD=Chemical Vapor Deposition [3]) has also been considered for producing good quality crystalline layers by seed regrowth.

The principle of LPE is to bring a liquid bath comprising the silicon and a solvent to a high temperature, but below the melting point of the silicon. Once the substrate to be coated is introduced in contact with the bath, the growth takes place by gradually lowering the temperature of the bath (by 0.1° C./min to 1° C./min). The advantages of the technique are a moderate cost, a high solidification rate (typically 0.15-1.5 µm/min) and the possibility of obtaining good quality crystalline layers.

CVD technology is itself based on the decomposition of a gaseous precursor, silane or a chlorosilane, in the vicinity of the substrate to be coated.

However, in these two alternatives, illustrated by the references cited above, in order to obtain layers of sufficient quality, it is necessary to resort to monocrystalline, and therefore expensive, substrates.

Yet for the purposes of reducing the costs, it is essential to avoid the use of monocrystalline substrates.

In order to produce polycrystalline silicon substrates, a novel technique based on the sintering of silicon powders has recently been proposed [4]. This technique proposes to produce a silicon wafer in two steps. The first step consists of hot pressing a bed of powders in a mold, and the second step consists of thermal sintering. Unfortunately, in order to enable effective sintering, the initial crystallites must be of submicron size. Yet the maturation during the process does not make it possible to obtain grains having a size of greater than 2 µm, even after several hours at 1350° C. [5]. Such small sizes are unacceptable for photovoltaic substrate applications.

To compensate for this problem, various liquid-phase grain maturation processes have already been proposed. For example, S. Reber et al. [3] proposes a process that requires the surface of a sintered wafer to be heated by infrared lamps or laser in order to melt the silicon at the surface over a thickness of the order of 10-20 µm. The liquid silicon then recrystallizes in the form of millimeter-sized grains on cooling. However, silicon is a material that has a high melting point (1410° C.) and that is highly reactive. This reactivity may pose a certain number of problems, especially if the support for the silicon layer is not of high purity. Yet, for the fundamental purpose of lowering the costs of photovoltaic energy, it is important to limit the purity constraints on the materials used for this recrystallization step.

Therefore, there remains the need for a process that is easy to implement and that makes it possible to produce coarse-grained silicon layers, that is to say having a mean size of greater than 20 µm, preferably 50 µm, more preferably still 100 µm, from an inexpensive silicon substrate like sintered silicon, the mean grain size of which is generally less than 2 µm.

In particular, the present invention aims to propose a process of use for attaining a crystalline silicon layer having a mean grain size of greater than or equal to 20 µm, from a silicon layer of which the mean grain size may be less than 2 µm.

More specifically, the present invention relates, according to a first of its aspects, to a process of use for forming a crystalline silicon layer formed from grains having a mean size of greater than or equal to 20 µm, comprising at least the steps consisting in:

(1) providing a layer of silicon to be (re)crystallized, the mean size of the grains of which is less than 10 µm;

(2) bringing said layer of silicon to be (re)crystallized into contact with a liquid composition formed completely or partly from at least one metallic solvent; and (3) exposing the assembly to a heat treatment suitable for the (re)crystallization of said layer of silicon to the expected grain size, characterized in that said heat treatment comprises heating of the assembly formed by the silicon layer in contact with said liquid composition at a temperature below 1410° C. and at least equal to the eutectic temperature in the solvent-silicon phase diagram.

More specifically, the temperature considered for the heat treatment is suitable for the evaporation of said liquid metallic solvent and therefore for obtaining a silicon supersaturation of said liquid composition.

As specified below, the expression solvent is used in the present text to denote either a single metallic solvent or a mixture of metallic solvents.

Similarly, within the meaning of the invention, the expression "eutectic temperature" is understood to mean the lowest melting point in the solvent-silicon phase diagram.

Thus, when the solvent considered is a mixture of solvents, the "eutectic temperature" is the lowest melting point in the phase diagram of said solvent mixture with the silicon.

Thus, the fact that the composition is liquid means that the melting point of the solvent is below 1410° C. and/or that the solvent forms a eutectic with the silicon at a temperature below 1410° C.

Advantageously, said heat treatment is carried out until said metallic solvent has completely evaporated.

In the invention, the layer of silicon to be (re)crystallized is not monocrystalline, which is advantageous in terms of cost. Advantageously, the layer of silicon to be (re)crystallized is polycrystalline formed from grains having a mean size preferably of less than or equal to 5 μm or even 2 μm. As specified below, this silicon layer may be represented by a supported or unsupported sintered silicon layer.

Against all expectation, the inventors have indeed observed that it is possible to attain, from such a silicon layer, coarse-grained crystalline silicon via a maturation process carried out at a temperature significantly lower than the melting point of silicon.

More specifically, the inventors have observed that bringing a specific molten liquid metallic solvent into contact with the layer of silicon to be (re)crystallized makes it possible to effectively control the maturation process of the grains forming this layer. The inventors have observed a transport of silicon into the low melting point metallic solvent. Evaporation of this metallic solvent makes it possible to control the silicon supersaturation of the liquid phase and therefore the corresponding (re)crystallization phenomenon.

Such a result is surprising since it is unexpected that the sole use of a liquid phase in accordance with the invention is sufficient to ensure the transport of silicon between the grains. Indeed, it is known that naturally the metals proposed for constituting the liquid metallic solvent considered according to the invention do not effectively wet the silicon.

Indeed, it is known that the native oxide layer at the surface of the grains is stable at least up to temperatures of the order of 1000° C.-1050° C. [5]. Yet the inventors have observed, against all expectation, that the maturation of the grains was possible at such temperatures.

The process of the invention therefore proves particularly advantageous.

Firstly, it makes it possible to attain a coarse-grained crystalline silicon layer, in particular having a mean grain size of greater than or equal to 20 μm, especially greater than or equal to 50 μm, in particular greater than or equal to 100 μm. Such a crystallographic structure advantageously ensures high energy conversion efficiencies during the use thereof in a photovoltaic cell.

Furthermore, the process of the invention uses, as starting silicon substrate, non-monocrystalline silicon layers and therefore inexpensive silicon, for example of sintered silicon wafer type.

Finally, the process may be carried out simultaneously on several silicon substrates.

Other features, advantages and methods of application of the process according to the invention will emerge more clearly on reading the following description, given by way of illustration and without implied limitation.

In the remainder of the text, the expressions "between . . . and . . . ", "ranging from . . . to . . . " and "varying from . . . to . . . " are equivalent and are understood to mean that the limits are included, unless otherwise mentioned.

Unless otherwise mentioned, the expression "having/comprising a" should be understood as "having/comprising at least one".

DESCRIPTION OF THE PROCESS ACCORDING TO THE INVENTION

As it emerges from the aforegoing, the process according to the invention is based on a process of maturation of silicon grains brought into contact with a composition formed completely or partly from at least one molten metallic solvent and according to a specific thermal process.

a) Composition Based on Metallic Solvent(s)

Within the meaning of the invention, the composition may be formed from a single metallic solvent, several metallic solvents or else a mixture of one or more metallic solvents with one or more other additional materials described in detail below.

Throughout the description, the expression solvent will be used to denote either a single metallic solvent or a mixture of metallic solvents.

However, this composition is generally formed for the most part, that is to say in a proportion of at least 80% by weight, or even of at least 90% or 95% by weight, of metallic solvent(s).

Metallic Solvent

Within the context of the present invention, the metallic solvent is advantageously selected from materials that are at the same time likely not to pollute the silicon, in order not to cause damage to the photovoltaic properties of the expected material, and that have sufficient volatility to allow silicon supersaturation of the liquid composition in step (3) of the process of the invention.

Moreover, it is advantageously selected so that the evaporation kinetics of the solvent during step (3) and therefore at the temperature of the process, are not too slow in view of the productivity of the process, nor too rapid so as not to favor the formation of grains of too small a size.

As specified above, the metallic solvent selected must be liquid during the contacting step (2) of the present invention. In order to achieve this, the temperature considered is generally at least equal to the melting point of said metallic solvent, or alternatively, at least equal to the temperature for forming a eutectic between said metallic solvent and the silicon.

It is clear that the choice of a metallic solvent with regard to the properties specified above falls within the competencies of a person skilled in the art.

By way of non-limiting illustration of the metallic solvents suitable for the invention, mention may especially be made of indium, tin, copper, gallium and alloys thereof.

According to one particularly preferred embodiment, the metallic solvent is selected from indium, tin and alloys thereof.

As specified above, a composition may comprise, besides one or more metallic solvents, at least one additional compound or material. According to one advantageous embodiment variant, a composition according to the invention may contain, in this regard, at least solid silicon.

The inventors have indeed observed that the presence of solid silicon makes it possible to optimize the standardization of the crystallization phenomenon, in terms of grain size, at the surface of the layer of silicon to be (re)crystallized, once the latter is (re)crystallized.

Advantageously, said silicon is present in said liquid composition, in a content ranging from 0 to 4% by weight, preferably from 0 to 2% by weight relative to the total weight of the composition.

Said liquid composition may for example be formed at least from tin and solid silicon.

According to one particular embodiment, said liquid composition may additionally incorporate at least one dopant selected from p-type dopants such as for example aluminum (Al), gallium (Ga), indium (In) and boron (B), and n-type dopants such as for example antimony (Sb), arsenic (As) and phosphorus (P), and mixtures thereof.

These dopants may be present in a proportion ranging from 0.05 to 5 atomic ppm, preferably 0.1 to 1 atomic ppm.

Of course, it is up to a person skilled in the art to adapt the volume of the liquid composition to be used in the process of the invention, with regard in particular to the surface of the layer of silicon to be (re)crystallized, its size and its thickness.

Generally, the volume of the composition is adapted so as to completely cover the layer of silicon to be (re)crystallized.

The preparation of such a liquid composition comes under the general knowledge of a person skilled in the art.

It is also up to a person skilled in the art to use suitable heating temperatures in order to form a composition in contact with the layer of silicon to be (re)crystallized that is completely liquid comprising said liquid metallic solvent and where appropriate said liquid silicon.

According to a first embodiment variant, said liquid composition is formed prior to being brought into contact with said layer of silicon to be (re)crystallized.

According to a first alternative, the metallic solvent or solvents are brought to a temperature at least equal to their melting point and the additional materials, if present, are added thereto. The mixture thus formed is then brought into contact with the layer to be (re)crystallized at a temperature at least equal to the eutectic temperature in the solvent-silicon phase diagram and below 1410° C.

According to a second alternative, the composition is formed by mixing, at ambient temperature or failing that at a temperature at which the metallic solvent remains solid, all of the compounds constituting said liquid composition and consecutive heating of the solid mixture at a temperature at least equal to the melting point of the metallic solvent or solvents considered.

According to another embodiment variant, said liquid composition is formed directly on contact with said layer of silicon to be (re)crystallized via the provision, at the surface of said silicon layer, of a solid-phase composition comprising at least one metallic solvent intended to form said liquid composition, and the heating of the assembly at a temperature, at least equal to the eutectic temperature in the solvent-silicon phase diagram and below 1410° C.

According to this variant, said liquid composition may for example be formed at the surface of said layer of silicon to be (re)crystallized via the deposition at the surface of said silicon layer of solid indium followed by heating of the assembly at a temperature of 1000° C.

Still according to this variant, said liquid composition may for example be formed at the surface of said layer of silicon to be (re)crystallized via the deposition at the surface of said silicon layer of solid tin and solid silicon followed by heating of the assembly at a temperature of 1100° C.

As specified above, the assembly formed by the layer of silicon to be (re)crystallized and the composition according to the invention undergoes a heat treatment suitable for the maturation of the grains to be (re)crystallized.

b) Heat Treatment

Generally, the heat treatment is carried out at a temperature that is on the one hand below the melting point of silicon, i.e. below 1410° C. and on the other hand adjusted in order to attain a compromise between the rate of transport of silicon into the liquid phase, generally favored by high temperatures, and the limitation of the pollution induced by the material supporting the layer of silicon to be (re)crystallized, generally favored by low temperatures.

More specifically, the heat treatment of the assembly formed in step (2) requires a temperature that is compatible with the evaporation of said liquid metallic solvent and therefore the obtaining of a silicon supersaturation of said liquid composition.

Advantageously, step (3) may be carried out while maintaining a constant temperature that enables the vaporization of all of said liquid metallic solvent.

Thus, the temperature considered according to the invention for the heat treatment advantageously varies from 800° C. to 1350° C., preferably from 1000° C. to 1200° C.

Of course, the temperature to be used in order to obtain silicon supersaturation in the liquid phase and the evaporation of said liquid metallic solvent is capable of varying significantly within this interval with regard to the nature of the liquid metallic solvent used.

Thus, according to one particular embodiment, the formation of said (re)crystallized silicon layer may be carried out using a liquid composition of tin and solid silicon, the temperature of which is maintained in step (3) between 1050° C. and 1150° C.

According to another particular embodiment, the formation of said (re)crystallized silicon layer may be carried out using a liquid composition of indium, the temperature of which is maintained in step (3) between 950° C. and 1050° C.

According to one particular embodiment, this heat treatment step is performed over a duration of at least 2 hours.

It emerges below from the examples that the contacting step (2) and the heat treatment step may be carried out in a crucible or a sample holder made of graphite that withstands temperatures compatible with those required by the process of the invention.

This heat treatment step may be carried out by any heating technique known to a person skilled in the art and conventionally used for producing photovoltaic cells, for example in a tunnel furnace or else a resistance heating furnace.

This heat treatment step is suitable for the simultaneous (re)crystallisation of several wafers.

In this case, said liquid composition is generally formed prior to be brought into contact with the layers of silicon to be (re)crystallized and said layers are then submerged in said composition.

The invention may be used with various additional agitation systems (magnetic agitation, vibrating table agitation, etc.) in order to improve and standardize the evaporation kinetics.

The use of such agitation systems proves particularly advantageous within the context of a simultaneous (re)crystallization of several wafers.

According to one particularly preferred embodiment, steps (2) and (3) of the process of the invention are carried out simultaneously.

c) Crystalline Silicon Layer Obtained According to the Process of the Invention

The crystalline silicon layer, formed at the end of step (3), is generally continuous and homogenous, and has a good quality, particularly suitable for the use thereof in a photovoltaic device.

As specified above, the silicon layer obtained at the end of step (3) of the process of the invention has a mean grain size of greater than or equal to 20 µm, especially greater than or equal to 50 µm, and preferably greater than or equal to 100 µm.

The mean size of the crystalline silicon grains can be measured by optical microscopy or with a scanning electron microscope.

According to another special feature of the crystalline silicon layer obtained at the end of step (3) of the process of the invention, the latter has a thickness ranging from 5 to 50 µm, in particular from 10 to 20 µm.

d) Layer of Silicon to be (Re)Crystallized

As specified above, this layer of silicon is not monocrystalline.

It may be formed from amorphous and/or polycrystalline silicon. It generally has grains with a mean size ranging from 0 to 10 µm, in particular from 0 to 5 µm, and preferably from 0 to 2 µm.

According to one particular embodiment, said layer of silicon to be (re)crystallized has grains with a mean size of greater than 30 nm, preferably greater than 100 nm, in particular greater than 500 nm, more particularly greater than 1 µm.

The layer of silicon from step (1) may have a thickness ranging from 2 µm to 50 µm, preferably ranging from 5 µm to 20 µm.

Advantageously, the layer of silicon from step (1) is a cohesive layer.

The expression "cohesive layer" is understood within the meaning of the invention to mean a layer that is a one-piece layer, as opposed for example to a pulverulent layer, and the integrity of which is not adversely affected under the action of external forces and stresses of reasonable amplitude (compression, stretching, elongation, etc.).

According to one particular embodiment, the layer of silicon may comprise a p-type dopant, in particular boron or an n-type dopant, in particular phosphorus.

As a variant, said layer of silicon from step (1) is sintered.

The invention will now be described by means of the following examples, of course given by way of illustration and without implied limitation of the invention.

Example 1

The starting substrate is a sintered silicon wafer having a size of 5×5 cm$^2$, the mean grain size of which is 1 µm. A 6.6 g mass of pure indium is deposited on this wafer in the form of granules having a size of less than 3 mm.

The assembly is positioned in a graphite sample holder, introduced into a resistance heating furnace, brought to a temperature of 1000° C. for 4 h in order to enable the vaporization of the indium, then brought back to ambient temperature. The temperature increase and decrease ramps are both equal to 10° C./min.

At the end of the treatment, the surface of the substrate has grains with a mean size of 60 µm, but over around 20% of the surface, the initial fine-grained structure has not been converted.

Example 2

The starting substrate is a sintered silicon wafer having a size of 5×5 cm$^2$, the mean grain size of which is 0.8 µm. A 13.8 g charge of tin and silicon (98.2% by weight of tin–1.8% by weight of silicon) is deposited on this wafer in the form of a sheet having a thickness of 0.8 mm.

The assembly is positioned in a graphite sample holder, introduced into a resistance heating furnace, brought to a temperature of 1100° C. for 5 h in order to enable the vaporization of the tin, then brought back to ambient temperature. The temperature increase and decrease ramps are respectively 5° C./min and 10° C./min.

At the end of the treatment, the surface of the substrate has grains with a mean size of 25 µm. Advantageously, the entire surface initially having fine grains has been (re)crystallised.

[1] K. Peter et al., "Thin film silicon solar cells on upgraded metallurgical silicon substrates prepared by LPE"; Solar Energy Materials and Solar Cells 74 (2002) 219.
[2] J. M. Olchowik et al., "Influence of LPE process technological conditions on Si ELO layers morphology", J. Non-Crystalline Solids 354 (2008) 4287.
[3] S. Reber, A. Hurrle, A. Eyer, G. Wilke, "Crystalline silicon thin film solar Cells—recent results at Fraunhoffer ISE", Solar Energy, 77 (2004) 865-875.
[4] Patent WO 2004/093202.
[5] J. M. Lebrun, C. Pascal, J. P. Missiaen, J. Am. Ceramic. Soc., 1-9 (2012), DOI: 10.1111/j.1551-2916.2011.05052.x.

The invention claimed is:

1. A process for forming a crystalline silicon layer comprising grains having a mean size of greater than or equal to 20 µm, the process comprising the steps of:
   (1) providing a cohesive layer of silicon to be (re)crystallized, the mean size of the grains of which is less than 10 µm;
   (2) bringing said cohesive layer of silicon to be (re)crystallized into contact with a liquid composition formed completely or partly from at least one metallic solvent; and
   (3) exposing the assembly formed by the silicon layer in contact with said liquid composition to a heat treatment suitable for the (re)crystallization of said layer of silicon to the expected grain size,
   wherein said heat treatment comprises heating of the assembly at a temperature below 1410° C. and at least the eutectic temperature in the solvent-silicon phase diagram.

2. The process as claimed in claim 1, wherein the heat treatment is carried out at a temperature ranging from 800° C. to 1350° C.

3. The process as claimed in claim 1, wherein the heat treatment is carried out until said metallic solvent has completely evaporated.

4. The process as claimed in claim 1, wherein steps (2) and (3) are carried out simultaneously.

5. The process as claimed in claim 1, wherein the silicon layer obtained has a mean grain size of greater than or equal to 50 µm.

6. The process as claimed in claim 1, wherein said silicon layer from step (1) is formed from amorphous and/or polycrystalline silicon having grains with a mean size ranging from 0 to 5 µm.

7. The process as claimed in claim 1, wherein said metallic liquid solvent is selected from indium, tin, copper, gallium, and alloys thereof.

8. The process as claimed in claim 1, wherein said liquid composition additionally comprises at least one dopant selected from aluminum, gallium, indium, boron, antimony, arsenic, phosphorus and mixtures thereof.

9. The process as claimed in claim 1, wherein said liquid composition additionally comprises solid silicon.

10. The process as claimed in claim 9, wherein said silicon is present in said liquid composition, in a content ranging from 0 to 4% by weight relative to the total weight of the composition.

11. The process as claimed in claim 9, wherein said silicon is present in said liquid composition, in a content ranging from 0 to 2% by weight relative to the total weight of the composition.

12. The process as claimed in claim 1, wherein said liquid composition comprises tin and solid silicon.

13. The process as claimed in claim 1, wherein said liquid composition is formed prior to being brought into contact with said layer of silicon to be (re)crystallized.

14. The process as claimed in claim 1, wherein said liquid composition is formed on contact with said layer of silicon to be (re)crystallized via the provision, at the surface of said silicon layer, of a solid-phase composition comprising at least one metallic solvent intended to form or become part of said liquid composition, and the heating of the assembly at a temperature at least the eutectic temperature in the solvent-silicon phase diagram and below 1410° C.

15. The process as claimed in claim 1, wherein the heat treatment is carried out at a temperature ranging from 1000° C. to 1200° C.

16. The process as claimed in claim 1, wherein the silicon layer obtained has a mean grain size of greater than or equal to 100 μm.

17. The process as claimed in claim 1, wherein said silicon layer from step (1) is formed from amorphous and/or polycrystalline silicon having grains with a mean size ranging from 0 to 2 μm.

18. The process as claimed in claim 1, wherein said metallic liquid solvent is selected from indium, tin and alloys thereof.

* * * * *